United States Patent
Kuo et al.

(10) Patent No.: US 10,403,379 B1
(45) Date of Patent: Sep. 3, 2019

(54) ERASED BLOCK REVERIFICATION METHOD FOR SOLID STATE STORAGE DEVICE

(71) Applicants: Lite-On Electronics (Guangzhou) Limited, Guangzhou (CN); LITE-ON TECHNOLOGY CORPORATION, Taipei (TW)

(72) Inventors: Chun-Wei Kuo, Taipei (TW); Ding-Chiuan Huang, Taipei (TW); Shih-Jia Zeng, Taipei (TW)

(73) Assignees: LITE-ON ELECTRONICS (GUANGZHOU) LIMITED, Guangzhou (CN); LITE-ON TECHNOLOGY CORPORATION, Taipei (TW)

( * ) Notice: Subject to any disclaimer, the term of this patent is extended or adjusted under 35 U.S.C. 154(b) by 0 days.

(21) Appl. No.: 16/029,784

(22) Filed: Jul. 9, 2018

(30) Foreign Application Priority Data

May 11, 2018 (CN) .......................... 2018 1 0448281

(51) Int. Cl.
| | | |
|---|---|---|
| *G11C 16/06* | (2006.01) | |
| *G11C 16/34* | (2006.01) | |
| *G11C 16/26* | (2006.01) | |
| *G11C 16/16* | (2006.01) | |
| *G11C 11/56* | (2006.01) | |
| *G11C 16/04* | (2006.01) | |

(52) U.S. Cl.
CPC .......... *G11C 16/3445* (2013.01); *G11C 16/16* (2013.01); *G11C 16/26* (2013.01); *G11C 16/349* (2013.01); *G11C 11/5635* (2013.01); *G11C 16/0483* (2013.01)

(58) Field of Classification Search
CPC ..... G11C 16/04; G11C 16/16; G11C 16/3409; G11C 16/3445; G11C 8/12; G11C 29/46; G11C 16/0483; G11C 13/004; G11C 11/5628; G11C 16/26; G11C 16/3418; G11C 13/0002; G11C 13/003; G11C 16/10; G11C 13/0061; G11C 11/1659; G11C 13/0069; G11C 2211/5621
USPC .... 365/185.11, 201, 185.22, 185.17, 185.03, 365/148, 185.24, 189.05, 230.03, 200, 365/185.09, 185.23, 185.25, 185.27, 365/185.29, 189.08, 100, 185.05, 185.08, 365/185.18, 189.17; 701/45; 711/172
See application file for complete search history.

(56) References Cited

U.S. PATENT DOCUMENTS

2014/0169093 A1* 6/2014 Parat ...................... G11C 16/16
365/185.11

\* cited by examiner

*Primary Examiner* — Thong Q Le
(74) *Attorney, Agent, or Firm* — WPAT, PC

(57) ABSTRACT

An erased block reverification method for a solid state storage device is provided. Firstly, an erase command corresponding to a selected block is issued to an array control circuit. When an erase pass message is received, a judging step is performed to judge whether a setting condition of the selected block is satisfied. If the setting condition of the selected block is satisfied, the selected block is recorded as a good block. If the setting condition of the selected block is not satisfied, a selected block reverification process is performed. During the selected block reverification process, a data of the selected block is read and the selected block is recorded as the good block or a defective block according to a number of memory cells of the selected block in a non-erase state.

10 Claims, 4 Drawing Sheets

ERASED BLOCK REVERIFICATION METHOD FOR SOLID STATE STORAGE DEVICE

This application claims the benefit of People's Republic of China Patent Application No. 201810448281.5, filed May 11, 2018, the subject matter of which is incorporated herein by reference.

FIELD OF THE INVENTION

The present invention relates to a control method for a solid state storage device, and more particularly to an erased block reverification method for a solid state storage device.

BACKGROUND OF THE INVENTION

As is well known, solid state storage devices such as SD cards or solid state drives (SSD) are widely used in a variety of electronic devices.

Generally, a solid state storage device comprises a non-volatile memory. After data are written to the non-volatile memory, if no electric power is supplied to the solid state storage device, the data are still retained in the non-volatile memory. A flash memory is one of the widely-used non-volatile memories. In addition, a NAND-based flash memory is the non-volatile memory with the largest capacity.

FIG. 1 is a schematic functional block diagram illustrating the architecture of a conventional solid state storage device. As shown in FIG. 1, the solid state storage device 10 comprises an interface controller 101 and a non-volatile memory 105. The non-volatile memory 105 further comprises a memory cell array 109 and an array control circuit 111.

The solid state storage device 10 is connected with a host 14 through an external bus 12. For example, the external bus 12 is an USB bus, a SATA bus, a PCIe bus, a M.2 bus, an U.2 bus, or the like.

Moreover, the interface controller 101 is connected with the non-volatile memory 105 through an internal bus 113. According to a write command from the host 14, the interface controller 101 controls the array control circuit 111 to store the write data from the host 14 to the memory cell array 109. Alternatively, according to a read command from the host 14, the interface controller 101 controls the array control circuit 111 to acquire a read data from the memory cell array 109. In addition, the read data is transmitted to the host 14 through the interface controller 101.

Generally, the interface controller 101 stores a default read voltage set. During a read cycle, the interface controller 101 transmits an operation command to the array control circuit 111 of the non-volatile memory 105 through the internal bus 113. Consequently, the interface controller 101 allows the array control circuit 111 to read the previously-stored data from the memory cell array 109 of the non-volatile memory 105 according to the default read voltage set.

The interface controller 101 further comprises an error correction (ECC) unit 104 for correcting the error bits of the read data. After the error bits of the read data are corrected, the accurate read data is transmitted to the host 14. The operating principles will be described as follows.

Depending on the amount of the data to be stored in the memory cell, the memory cells may be classified into four types, i.e. a single-level cell (SLC), a multi-level cell (MLC), a triple-level cell (TLC) and a quad-level cell (QLC). The SLC can store only one bit of data per cell. The MLC can store two bits of data per cell. The TLC can store three bits of data per cell. The QLC can store four bits of data per cell. In other words, the memory cell array 109 is a SLC memory cell array, a MLC memory cell array, a TLC memory cell array or a QLC memory cell array.

In the memory cell array 109, each memory cell comprises a floating gate transistor. By adjusting the number of hot carriers injected into a floating gate of the floating gate transistor, the array control circuit 111 controls the storing state of the floating gate transistor. In other words, the floating gate transistor of each SLC has two storing states, the floating gate transistor of each MLC has four storing states, the floating gate transistor of each TLC has eight storing states, and the floating gate transistor of each QLC has sixteen storing states.

FIG. 2 schematically illustrates the ideal threshold voltage distribution curves of triple-level cells in different storing states. According to the number of injected hot carriers, the triple-level cell has eight storing states "Erase" and "A"~"G". Before the hot carriers are injected into the memory cell, the memory cell is in the storing state "Erase". After the hot carriers are injected into the memory cell, the memory cell is in the storing state "A". As the number of the injected hot carriers increases, the memory cell is sequentially in the other seven storing states "A"~"G". For example, the memory cell in the storing state "G" has the highest threshold voltage, and the memory cell in the storing state "Erase" has the lowest threshold voltage.

Please refer to FIG. 2. For example, the memory cell storing the data "111" is in the storage state "Erase". The memory cell storing the data "011" is in the storage state "A". The memory cell storing the data "001" is in the storage state "B". The memory cell storing the data "101" is in the storage state "C". The memory cell storing the data "100" is in the storage state "D". The memory cell storing the data "000" is in the storage state "E". The memory cell storing the data "010" is in the storage state "F". The memory cell storing the data "110" is in the storage state "G".

In practice, even if many memory cells are in the same storing state during the program cycle, the threshold voltages of these memory cells are not all identical. That is, the threshold voltages of these memory cells are distributed in a specified distribution curve with a median threshold voltage. The median threshold voltage of the memory cells in the storing state "Erase" is Ver. The median threshold voltage of the memory cells in the storing state "A" is Va. The median threshold voltage of the memory cells in the storing state "B" is Vb. The median threshold voltage of the memory cells in the storing state "C" is Vc. The median threshold voltage of the memory cells in the storing state "D" is Vd. The median threshold voltage of the memory cells in the storing state "E" is Ve. The median threshold voltage of the memory cells in the storing state "F" is Vf. The median threshold voltage of the memory cells in the storing state "G" is Vg. For example, the median threshold voltage for a greater number of memory cells in the storing state "A" is Va.

Please refer to FIG. 2 again. According to the above characteristics of the triple-level cell, a read voltage set including seven read voltages Vra~Vrg is defined. During the read cycle, the array control circuit 111 provides the seven read voltages of the read voltage set Vra~Vrg, in a predefined order, to the array control circuit 111 in order to detect the storing states of the triple-level cells in the memory cell array 109.

During the read cycle, the array control circuit 111 has to perform at least three read steps to judge the storing state of the triple-level cell. An example of judging the storing state "C" of the triple-level cell will be described as follows.

In the first read step, the array control circuit 111 provides the read voltage Vrd to the memory cell array 109. If the threshold voltage of the memory cell is lower than the read voltage Vrd and the memory cell is turned on, the array control circuit 111 judges that the memory cell is in the storing state "Erase", "A", "B" or "C". Whereas, if the threshold voltage of the memory cell is higher than the read voltage Vrd and the memory cell is turned off, the array control circuit 111 judges that the memory cell is in the storing state "D", "E", "F" or "G".

In the second read step, the array control circuit 111 provides the read voltage Vrb to the memory cell array 109. If the threshold voltage of the memory cell is higher than the read voltage Vrb and the memory cell is turned off, the array control circuit 111 judges that the memory cell is in the storing state "B" or "C". Whereas, if the threshold voltage of the memory cell is lower than the read voltage Vrb and the memory cell is turned on, the array control circuit 111 judges that the memory cell is in the storing state "Erase" or "A".

In the third read step, the array control circuit 111 provides the read voltage Vrc to the memory cell array 109. If the threshold voltage of the memory cell is higher than the read voltage Vrc and the memory cell is turned off, the array control circuit 111 judges that the memory cell is in the storing state "C". Whereas, if the threshold voltage of the memory cell is lower than the read voltage Vrc and the memory cell is turned on, the array control circuit 111 judges that the memory cell is in the storing state "B".

As mentioned above, the storing state of the triple-level cell is determined according to the seven read voltages Vra~Vrg of the read voltage set. In the three read steps of the read cycle, three read voltages of the seven read voltages Vra~Vrg are selected to determine the storing state of the triple-level cell.

Similarly, the default read voltage set for the single-level cell includes one read voltage. After one read step is performed, the two storing states of the single-level cells are determined according to the read voltage of the default read voltage set.

Similarly, the default read voltage set for the multi-level cell includes three read voltages. After two read steps are performed, the four storing states of the multi-level cells are determined according to three read voltages of the default read voltage set.

Similarly, the default read voltage set for the quad-level cell includes fifteen read voltages. After four read steps are performed, the sixteen storing states of the quad-level cells are determined according to fifteen read voltages of the default read voltage set.

Moreover, the interface controller 101 erases the contents of the non-volatile memory 105 in a block-wise fashion. When the interface controller 101 intends to erase the contents of a selected block of the memory cell array 109, an erase command corresponding to the selected block is transmitted from the interface controller 101 to the non-volatile memory 105.

After an erase cycle, all memory cells in the selected block of the memory cell array 109 are restored to the storing state "Erase". In the storing state "Erase", no hot carriers are injected into the memory cell.

For verifying whether all memory cells of the selected block are restored to the storing state "Erase", an incremental step pulse erase (ISPE) technology has been disclosed. The array control circuit 111 uses the ISPE technology to erase the contents of the selected block.

FIG. 3 is a schematic timing waveform diagram illustrating the associated voltages processed by the ISPE technology. By using the ISPE technology, the memory cells in the selected block of the memory cell array 109 are restored to the storing state "Erase" according to a pulse signal. The erase cycle comprises plural erase steps. Each erase step contains an erase pulse period and a verification period.

The period between the time point to and the time point tb is an erase pulse period (Te1) of the first erase step. In the erase pulse period Te1, the erase pules with an amplitude Vp1 is provided from the array control circuit 111 to the memory cell array 109 to erase the contents of all memory cells in the selected block.

The period between the time point tb and the time point tc is an erase verification period (Tv1) of the first erase step. In the erase verification period Tv1, a verification pules is provided from the array control circuit 111 to the memory cell array 109. According to the output current from the selected block, the array control circuit 111 verifies whether the erase operation is successful. If the array control circuit 111 verifies that the erase operation is not successful, the second erase step is continuously performed.

The period between the time point tc and the time point td is an erase pulse period (Te2) of the second erase step. In the erase pulse period Te2, the erase pules with an amplitude Vp2 is provided from the array control circuit 111 to the memory cell array 109 to erase the contents of all memory cells in the selected block. The amplitude Vp2 is higher than the amplitude Vp1.

The period between the time point td and the time point te is an erase verification period (Tv2) of the second erase step. In the erase verification period Tv2, a verification pules is provided from the array control circuit 111 to the memory cell array 109. According to the output current from the selected block, the array control circuit 111 verifies whether the erase operation is successful. If the array control circuit 111 verifies that the erase operation is not successful, the third erase step is continuously performed.

The period between the time point te and the time point tf is an erase pulse period (Te3) of the third erase step. In the erase pulse period Te3, the erase pules with an amplitude Vp3 is provided from the array control circuit 111 to the memory cell array 109 to erase the contents of all memory cells in the selected block. The amplitude Vp3 is higher than the amplitude Vp2.

The period between the time point tf and the time point tg is an erase verification period (Tv3) of the third erase step. In the erase verification period Tv3, a verification pules is provided from the array control circuit 111 to the memory cell array 109. According to the output current from the selected block, the array control circuit 111 verifies whether the erase operation is successful. If the array control circuit 111 verifies that the erase operation is successful, the erase cycle is ended.

As mentioned above, the array control circuit 111 performs at least one erase step during the erase cycle. If the array control circuit 111 verifies that the selected block has not been successfully erased, the erase pules with the higher amplitude is provided from the array control circuit 111 to the memory cell array 109. Moreover, the next erase step is performed until the array control circuit 111 verifies that the selected block has been successfully erased. As shown in FIG. 3, the array control circuit 111 verifies that the selected block has been successfully erased after three erase steps of the erase cycle.

After the array control circuit 111 verifies that the selected block has been successfully erased, the array control circuit 111 issues an erase pass message to the interface controller 101. According to the erase pass message, the selected block is recorded as a blank block by the interface controller 101. In the subsequent program cycle, the write data from the host 14 can be stored in the blank block.

With increasing development of the semiconductor manufacturing process, the structure of the memory cell array becomes more complicated and the capacity of the memory cell array is gradually increased. Consequently, the solid state storage device with the 2D NAND flash memory is gradually replaced by the solid state storage device with the 3D NAND flash memory.

However, the above verification method still has some drawbacks. After the erase command is transmitted from the interface controller 101 to the non-volatile memory 105 and the array control circuit 111 verifies that the selected block has been successfully erased, the array control circuit 111 issues the erase pass message to the interface controller 101. However, in practice, some memory cells of the selected block are still not restored to the storing state "Erase".

If such fake-erased block is used for storing the write data from the host, many error bits will be generated during the read cycle. Moreover, if the fake-erased block contains too many error bits, the ECC circuit 104 of the interface controller 101 cannot correct the error bits. Under this circumstance, a read failure problem occurs.

SUMMARY OF THE INVENTION

An embodiment of the present invention provides an erased block reverification method for a solid state storage device. The solid state storage device includes an interface controller and a non-volatile memory. The non-volatile memory includes an array control circuit and a memory cell array. The erased block reverification method includes the following steps. Firstly, an erase command corresponding to a selected block is issued to the array control circuit. Then, a judging step is performed to judge whether a setting condition of the selected block is satisfied when an erase pass message is received. If the setting condition of the selected block is satisfied, the selected block is recorded as a good block. If the setting condition of the selected block is not satisfied, a selected block reverification process is performed. During the selected block reverification process, a bunch of data of the selected block is read and the selected block is recorded as the good block or a defective block according to a number of memory cells of the just-read data of the selected block in a non-erase state.

Another embodiment of the present invention provides an erased block reverification method for a solid state storage device. The solid state storage device includes an interface controller and a non-volatile memory. The non-volatile memory includes an array control circuit and a memory cell array. The erased block reverification method includes the following steps. Firstly, an erase command corresponding to a selected block is issued to the array control circuit. Then, a selected block reverification process is performed when an erase pass message is received. During the selected block reverification process, a bunch of data of the selected block is read and the selected block is recorded as a good block or a defective block according to a number of memory cells of the just-read data of the selected block in a non-erase state.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

Figure 1:
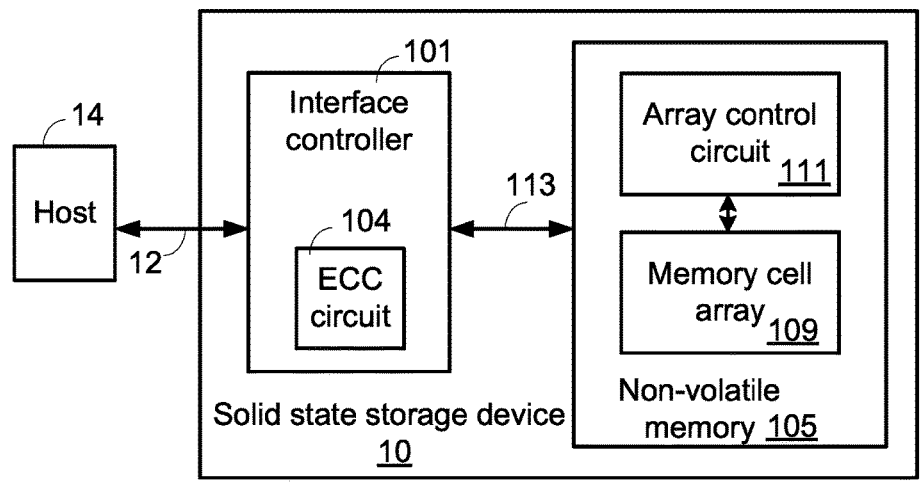
FIG. 1 (prior art) is a schematic functional block diagram illustrating the architecture of a conventional solid state storage device.
Figure 2:
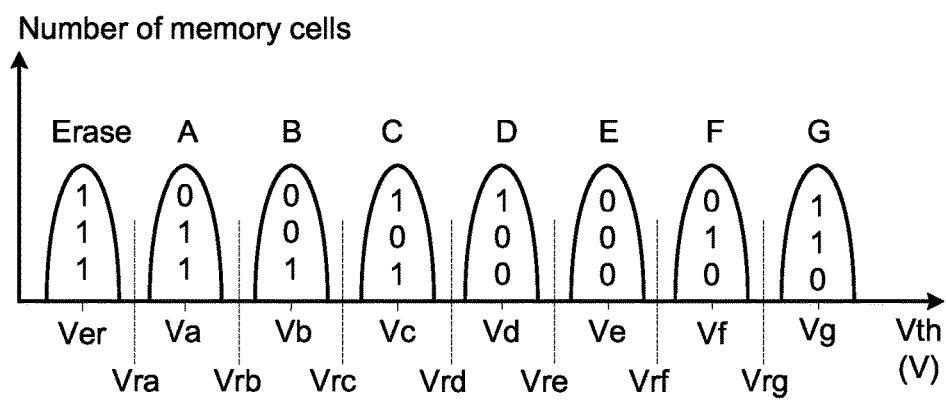
FIG. 2 (prior art) schematically illustrates the ideal threshold voltage distribution curves of triple-level cells in different storing states.
Figure 3:
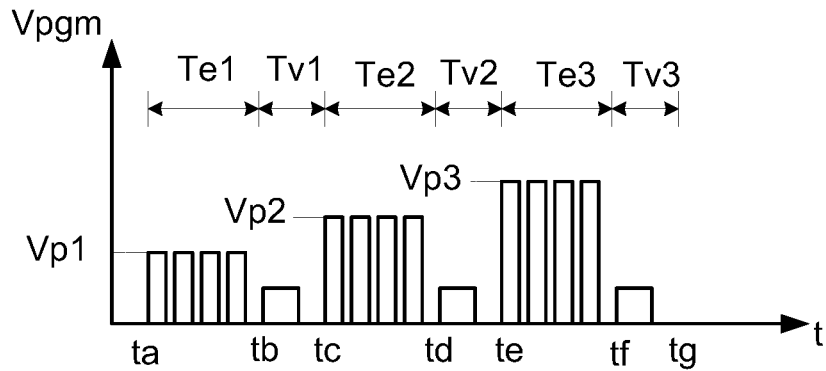
FIG. 3 (prior art) is a schematic timing waveform diagram illustrating the associated voltages processed by the ISPE technology.
Figure 4:
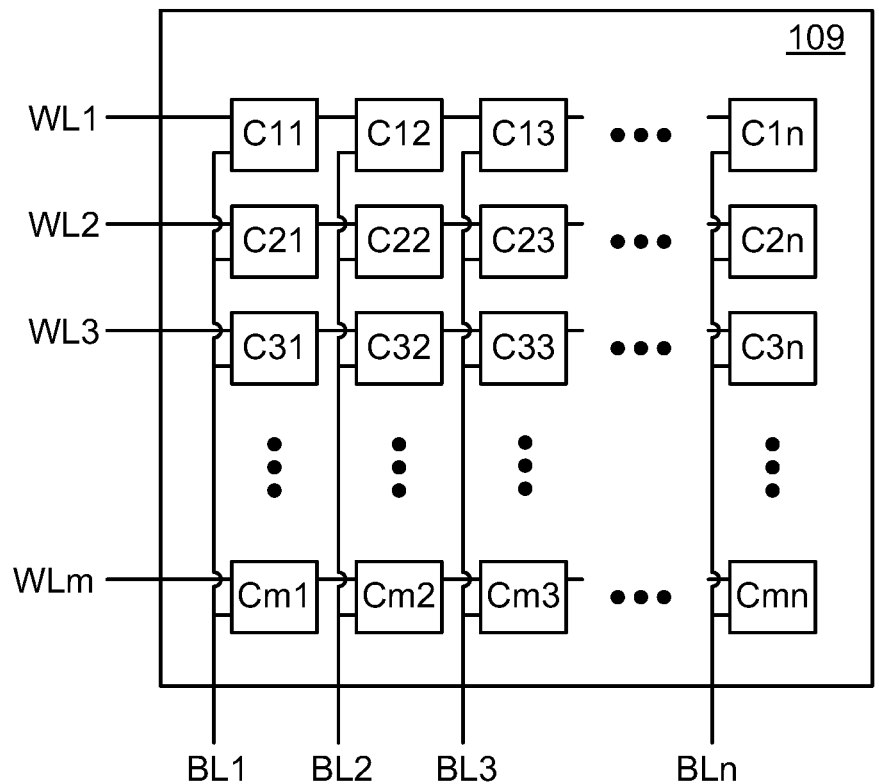
FIG. 4 schematically illustrating the architecture of a memory cell array of a solid state storage device according to an embodiment of the present invention.

FIG. 4 schematically illustrating the architecture of a memory cell array of a solid state storage device according to an embodiment of the present invention. As shown in FIG. 4, the memory cell array 109 comprises plural memory cells in an m×n array. The memory cell array 109 is connected with m word lines WL1~WLm and n bit lines BL1~BLn. Each word line is connected with a corresponding row of n memory cells. Moreover, the n memory cells in each row are connected with the n bit lines, respectively. For example, the word line WL2 is connected with the second row of n memory cells C21~C2$n$. Moreover, the n memory cells C21~C2$n$ are connected with the n bit lines BL1~BLn, respectively.

Moreover, the number of memory cells in each block of the memory cell array 109 is related to the connected word lines. For example, in case that a block of a TLC memory cell array is connected with 256 word lines, the size of the block is equal to (3×256×n) bits.

Figure 5:
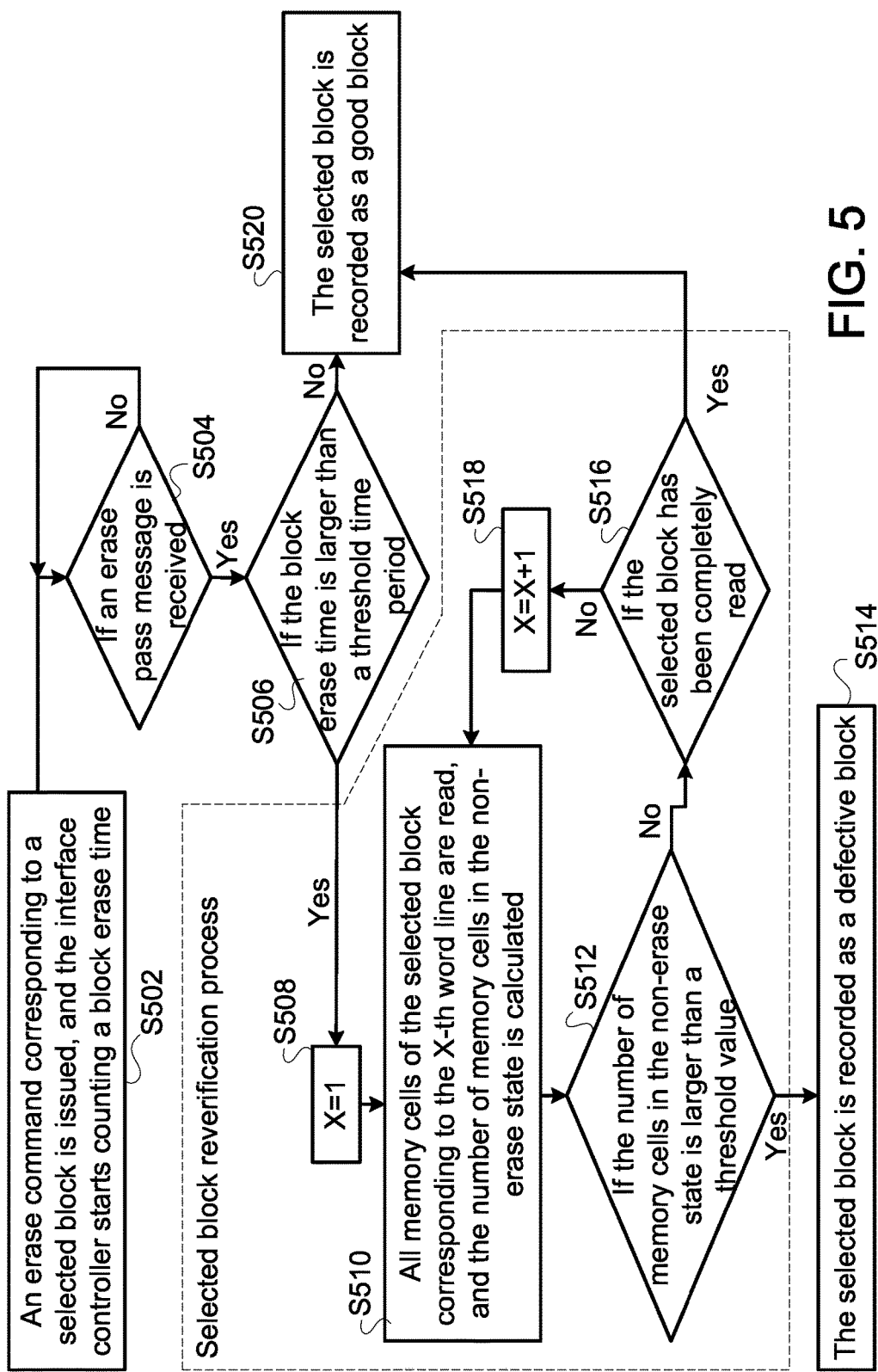
FIG. 5 is a flowchart illustrating an erased block reverification method according to an embodiment of the present invention.

The present invention provides an erased block reverification method. FIG. 5 is a flowchart illustrating an erased block reverification method according to an embodiment of the present invention.

Firstly, an erase command corresponding to a selected block is transmitted from the interface controller 101 to the array control circuit 111, and the interface controller 101 starts counting a block erase time (Step S502).

If the interface controller 101 receives an erase pass message from the array control circuit 111 (Step S504), the interface controller 101 judges whether the block erase time is larger than a threshold time period (Step S506). If the judging result of the step S506 indicates that the block erase time is not larger than the threshold time period, the selected block is recorded as a good block (Step S520). Whereas, if the judging result of the step S506 indicates that the block erase time is larger than the threshold time period, a selected block reverification process is performed.

That is to say, the contents of the selected block are erased by the array control circuit 111 within a short time period, the condition of the selected block is still acceptable. Under this circumstance, it is not necessary to perform the selected block reverification process, and the selected block is set as the good block. This good block can be directly used as a blank block for storing the write data from the host 14 in the subsequent process. Whereas, in case that a longer time period is required for the array control circuit 111 to erase the contents of the selected block, the condition of the selected block is possibly problematic. Meanwhile, the interface controller 101 has to perform the reverification process on the selected block.

During the selected block reverification process, the interface controller 101 reads the data from the selected block. Moreover, according to the number of memory cells of the just-read data are in the non-erase state, the interface controller 101 records the selected block as a good block or a defective block. In an embodiment, the interface controller 101 records the selected block as a good block or a defective block according to the number of memory cells corresponding to a specified word line are in the non-erase state. Alternatively, the interface controller 101 records the selected block as a good block or a defective block according to the total number of memory cells corresponding to the selected block are in the non-erase state. Take the TLC memory cell array for example. The storing state "Erase" is the erase state. The storing states "A"~"G" are the non-erase states.

During the selected block reverification process, the interface controller 101 has to verify the storing states of all memory cells corresponding to all bit lines of the selected block. If the number of the memory cells, which are in the non-erase state, of the selected block corresponding to any word line is larger than a threshold number, the selected block is recorded as a defective block. Whereas, if the number of the memory cells, which are in the non-erase state, of the selected block corresponding to each word line is not larger than the threshold number, the selected block is recorded as a good block. The principles will be described as follows.

In the beginning of the selected block reverification process, the interface controller 101 sets X=1 (Step S508). Then, all memory cells of the selected block corresponding to the X-th word line are read and the number of memory cells, which are in the non-erase state, is calculated (Step S510). If the number of memory cells in the non-erase state is larger than a threshold value (Step S512), the selected block is recorded as a defective block (Step S514).

If the judging condition of the step S512 indicates that the number of memory cells in the non-erase state is not larger than the threshold value and if the judging condition of the step S516 indicates that the selected block has not been completely read, the interface controller 101 sets X=X+1 (Step S518). Then, the step S510 is repeatedly done. Whereas, if the judging condition of the step S516 indicates that the selected block has been completely read, the selected block is recorded as a good block (Step S520). That is, after the memory cells of the selected memory corresponding to all word lines have been read and verified, the selected block is recorded as the good block.

In case that the selected block is recorded as the defective block, it means that many memory cells of the defective block are in the non-erase state. After the selected block is recorded as the defective block by the interface controller 101, the defective block is not used to store the write data from the host 14. Consequently, the possibility of resulting in the read failure problem will be largely reduced.

In the above embodiment, the defective block is determined according to the number of the memory cells of the selected block corresponding to any word line are in the non-erase state. It is noted that the way of determining the defective block may be varied according to the practical requirements.

For example, in another embodiment of the selected block reverification process, the total number of memory cells of the selected block in the non-erase state is calculated. If the total number of memory cells, which are in the non-erase state, of the selected block is larger than a predetermined number, the selected block is recorded as the defective block.

Figure 6:
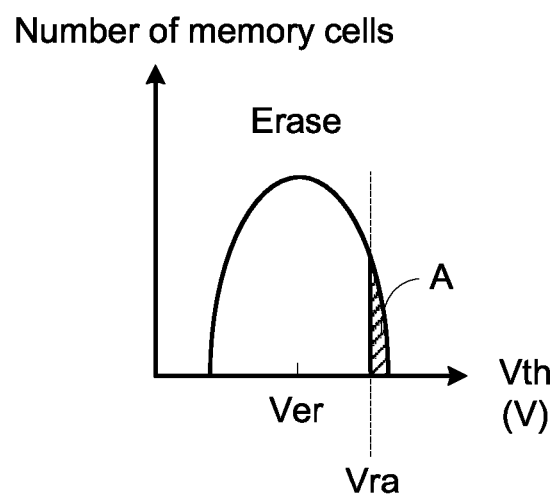
FIG. 6 schematically illustrates a threshold voltage distribution curve of the memory cells of the selected block in the storing state "Erase" after the contents of the selected block are erased.

FIG. 6 schematically illustrates a threshold voltage distribution curve of the memory cells of the selected block in the storing state "Erase" after the contents of the selected block are erased. During the selected block reverification process, the array control circuit 111 provides the read voltage Vra to the memory cell array 109 in order to determine the storing states of all memory cells of the selected block. As shown in FIG. 6, the memory cells in the zone A are determined to be in the non-erase state. If the number of memory cells in the zone A is larger than the predetermined number, the selected block is recorded as the defective block.

In accordance with the present invention, the erased block reverification method is implemented after the solid state storage device 10 is produced and before the solid state storage device 10 leaves the factory. In addition, the defective blocks are recorded. For example, in the testing stage before the solid state storage device 10 leaves the factory, the contents of the all memory cells of the memory cell array 109 are erased by the interface controller 101. Then, all blocks of the memory cell array 109 are subjected to the selected block reverification process. That is, regardless of whether the blocks are good or bad, all blocks of the memory cell array 109 are subjected to the selected block reverification process in the testing stage before the solid state storage device 10 leaves the factory. After the interface controller 101 issues the erase command and erase the selected block, the steps S508~S520 as shown in FIG. 5 are directly performed.

After the solid state storage device 10 leaves the factory, the solid state storage device 10 is used by the user. For enhancing the performance of the solid state storage device 10, the interface controller 101 performs the selected block reverification process on the inferior block according to the block erase time. That is, after the solid state storage device 10 leaves the factory, the interface controller 101 performs all steps of the flowchart as shown in FIG. 5.

In the embodiment of FIG. 5, the timing of performing the selected block reverification process is determined according to the block erase time. It is noted that numerous modifications and alterations may be made while retaining the teachings of the invention. For example, in another embodiment, the timing of performing the selected block reverification process is determined according to a block erase count. If the block erase count of the selected block is not larger than the threshold count, the selected block is recorded as a good block. Whereas, if the block erase count of the selected block is larger than the threshold count, the selected block reverification process is performed. Alternatively, if the block erase count of the selected block is larger than the threshold count and the block erase time of the selected block is larger than the threshold time period, the selected block reverification process is performed. That is, if one of the two judging conditions is not satisfied, the selected block is recorded as a good block.

Generally, after the memory cell array 109 of the solid state storage device 10 has been read, programmed and erased many times, the characteristics of the memory cell array 109 is gradually degraded and the number of the defective blocks is gradually increased. In case that the ECC circuit 104 is able to successfully correct the error bits, the interface controller 101 dynamically adjusts the read voltage Vra according to the degradation extent of the memory cell array 109. For example, the read voltage Vra is increased, the number of the defective blocks will be effectively reduced, the use life of the solid state storage device 10 is prolonged.

From the above descriptions, the present invention provides an erased block reverification method for a solid state storage device. In accordance with the conventional technology, the selected block is recorded as a blank block when the solid state storage device receives the erase pass message. In accordance with the present invention, the interface controller selectively performs the selected block reverification process according to a preset condition after the erase pass message is received. According to the judging result, the selected block is recorded as the good block or the defective block. Consequently, the possibility of resulting in the read failure problem will be largely reduced.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An erased block reverification method for a solid state storage device, the solid state storage device comprising an interface controller and a non-volatile memory, the non-volatile memory comprising an array control circuit and a memory cell array, the erased block reverification method comprising steps of:
   issuing an erase command corresponding to a selected block to the array control circuit;
   judging whether a setting condition of the selected block is satisfied when an erase pass message is received;
   if the setting condition of the selected block is satisfied, recording the selected block as a good block;
   if the setting condition of the selected block is not satisfied, performing a selected block reverification process;
   reading a data of the selected block in the selected block reverification process;
      if a number of the memory cells of each word line of the data of the selected block corresponding to any bit line which are in a non-erase state is larger than a threshold number, recording the selected block as a defective block; and
      if the number of the memory cells of each word line of the data of the selected block corresponding to each bit line which are in the non-erase state is not larger than the threshold number, recording the selected block as a good block.

2. The erased block reverification method as claimed in claim 1, wherein if a block erase time is not larger than a threshold time period, the setting condition is satisfied and the selected block is recorded as the good block, wherein if the block erase time is larger than the threshold time period, the setting condition is not satisfied and the selected block reverification process is performed.

3. The erased block reverification method as claimed in claim 1, wherein if a block erase count is not larger than a threshold count, the setting condition is satisfied and the selected block is recorded as the good block, wherein if the block erase count is larger than the threshold count, the setting condition is not satisfied and the selected block reverification process is performed.

4. The erased block reverification method as claimed in claim 1, wherein if a block erase time is not larger than a threshold time period or if a block erase count is not larger than a threshold count, the setting condition is satisfied and the selected block is recorded as the good block, wherein if the block erase time is larger than the threshold time period and if the block erase count is larger than the threshold count, the setting condition is not satisfied and the selected block reverification process is performed.

5. The erased block reverification method as claimed in claim 1, wherein the array control circuit provides a read voltage to the selected block of the memory cell array to read the data of the selected block.

6. The erased block reverification method as claimed in claim 5, wherein the interface controller dynamically adjusts the read voltage according to a degradation extent of the memory cell array.

7. An erased block reverification method for a solid state storage device, the solid state storage device comprising an interface controller and a non-volatile memory, the non-volatile memory comprising an array control circuit and a memory cell array, the erased block reverification method comprising steps of:
   issuing an erase command corresponding to a selected block to the array control circuit;
   performing a selected block reverification process when an erase pass message is received,
   reading a data of the selected block in the selected block reverification process;
      if a number of the memory cells of each word line of the data of the selected block corresponding to any bit line which are in a non-erase state is larger than a threshold number, recording the selected block as a defective block; and
      if the number of the memory cells of each word line of the data of the selected block corresponding to each bit line which are in the non-erase state is not larger than the threshold number, recording the selected block as a good block.

8. The erased block reverification method as claimed in claim 7, wherein the selected block reverification process comprises steps of:
   reading the data of the selected block;
   if the number of the memory cells of the data of the selected block which are in the non-erase state is larger than a predetermined number, recording the selected block as the defective block; and
   if the number of the memory cells of the data of the selected block which are in the non-erase state is not larger than the predetermined number, recording the selected block as the good block.

9. The erased block reverification method as claimed in claim 7, wherein the array control circuit provides a read voltage to the selected block of the memory cell array to read the data of the selected block.

10. The erased block reverification method as claimed in claim 9, wherein the interface controller dynamically adjusts the read voltage according to a degradation extent of the memory cell array.

* * * * *